United States Patent
Godrich et al.

(10) Patent No.: US 9,310,855 B2
(45) Date of Patent: Apr. 12, 2016

(54) FLEXIBLE DATA CENTER AND METHODS FOR DEPLOYMENT

(75) Inventors: Kfir L. Godrich, Morganville, NJ (US);
Peter Gross, Santa Monica, CA (US);
Scott A. Wilson, Glenmont, NY (US);
James Zuppan, Martinez, CA (US);
Christopher W. Kurkjian, Stephentown, NY (US); Gregory K. K. Young, Walnut Creek, CA (US); Peter F. Gmiter, Manhattan Beach, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 597 days.

(21) Appl. No.: 13/703,911

(22) PCT Filed: Jul. 12, 2010

(86) PCT No.: PCT/US2010/041734
§ 371 (c)(1),
(2), (4) Date: Dec. 13, 2012

(87) PCT Pub. No.: WO2012/008945
PCT Pub. Date: Jan. 19, 2012

(65) Prior Publication Data
US 2013/0094136 A1    Apr. 18, 2013

(51) Int. Cl.
*G06F 1/20* (2006.01)
*G06F 1/26* (2006.01)
(Continued)

(52) U.S. Cl.
CPC .............. *G06F 1/20* (2013.01); *H05K 7/1497* (2013.01); *H05K 7/20709* (2013.01); *H05K 7/20745* (2013.01); *Y10T 29/49826* (2015.01)

(58) Field of Classification Search
None
See application file for complete search history.

(56) References Cited

U.S. PATENT DOCUMENTS 7,278,273 B1 * 10/2007 Whitted et al. .............. 62/259.2
7,525,207 B2     4/2009 Clidaras et al.
(Continued)

FOREIGN PATENT DOCUMENTS

CN    101501599    8/2009
WO    WO-2007095144    8/2007
(Continued)

OTHER PUBLICATIONS

S. Madara, "The future of Cooling High Density Equipment." IBM Power and Cooling Technology Symposium. 2007, 34 pages.*
(Continued)

*Primary Examiner* — Dwin M Craig
*Assistant Examiner* — David M Rogers
(74) *Attorney, Agent, or Firm* — Brooks, Cameron & Huebsch, PLLC (57) ABSTRACT

Flexible data center systems and methods of deployment are provided. A flexible data center (100, 200) including T rows of server racks (106, 206, 306) can be deployed by constructing a number B of blocks (101, 201). Constructing each block (101, 201) can include constructing from one to a number P of perimeter structures (104, 204, 304) each housing up to a number R of rows of server racks (106, 206, 306). Constructing each block (102, 201) can include constructing a connecting structure (102, 202) connected to the perimeter structures (104, 204, 304), the connecting structure (102, 202) housing operations monitoring equipment (108, 208) for the server racks (106, 206, 306). A total integer number T/R of perimeter structures (104, 204, 304) can be constructed for the flexible data center (100, 200). At most one perimeter structure (10, 204, 304) houses less than R rows of server racks (106, 206, 306). B is equal to an integer number (T/R)/P. At most one block (101, 201) includes less than P perimeter structures (104, 204, 304).

12 Claims, 4 Drawing Sheets

(51) Int. Cl.
*H05K 7/14* (2006.01)
*H05K 7/20* (2006.01)

(56) References Cited

U.S. PATENT DOCUMENTS

| | | | | |
|---|---|---|---|---|
| 7,630,795 | B2* | 12/2009 | Campbell et al. | 700/300 |
| 7,864,530 | B1* | 1/2011 | Hamburgen et al. | 361/699 |
| 8,469,782 | B1* | 6/2013 | Roy | 454/187 |
| 2004/0227435 | A1 | 11/2004 | Rasmussen | |
| 2004/0240514 | A1 | 12/2004 | Bash et al. | |
| 2005/0235671 | A1* | 10/2005 | Belady et al. | 62/259.2 |
| 2006/0065000 | A1* | 3/2006 | Belady | 62/259.2 |
| 2007/0076373 | A1 | 4/2007 | Fink | |
| 2007/0187343 | A1* | 8/2007 | Colucci et al. | 211/26 |
| 2008/0029250 | A1* | 2/2008 | Carlson et al. | 165/104.33 |
| 2008/0055846 | A1* | 3/2008 | Clidaras et al. | 361/687 |
| 2008/0158818 | A1 | 7/2008 | Clidaras | |
| 2008/0232064 | A1* | 9/2008 | Sato et al. | 361/687 |
| 2009/0113323 | A1* | 4/2009 | Zhao et al. | 715/764 |
| 2009/0229194 | A1 | 9/2009 | Armillas | |
| 2010/0136895 | A1 | 6/2010 | Sgro | |
| 2010/0170277 | A1* | 7/2010 | Schmitt et al. | 62/259.2 |
| 2011/0100045 | A1* | 5/2011 | Carlson | 62/259.2 |
| 2011/0240265 | A1* | 10/2011 | Dechene et al. | 165/104.31 |

FOREIGN PATENT DOCUMENTS

| | | |
|---|---|---|
| WO | WO-2007139560 | 12/2007 |
| WO | WO-2009154623 | 12/2009 |

OTHER PUBLICATIONS

K. Darrow, "Opportunities for Combined Heat and Power in Data Centers," Cogeneration and Distributed Generation Journal, vol. 24, No. 3, 2009, 60 pages.*

P. Hannaford, "Ten Steps to Solving Cooling Problems Cause by High-Density Server Deployment" Telecommunications Conference, 2005, (INTELEC'05), Twenty-Seventh International, IEEE, 2005, pp. 609-616.*

R. Rajamony, et al., "Energy Management for Server Clusters." In Tutorial, 16th Annual ACM International Conference on Supercomputing, 2002, 80 pages.*

J. Cho, et al., "Viability of Datacenter Cooling Systems for Energy Efficiency in Temperate or Subtropical Regions: Case Study," Energy and Buildings, vol. 55, 2012, pp. 189-197.*

H. Sun, et al., "Case Study of Data Centers' Energy Performance," Energy and Buildings, vol. 38, 2006, pp. 522-533.*

C. Patel, et al., "Thermal Considerations in Cooling Large Scale High Compute Density Data Centers." Thermal and Thermomechanical Phenomena in Electronic Systems, 2002. ITHERM 2002. The Eighth Intersociety Conference on, IEEE, 2002, pp. 767-776.*

A. Kumar, "Use of Air Side Economizer for Data Center Thermal Management." Masters Degree Thesis, Georgia Institute of Technology, 2008, 145 pages.*

Yu, Zhirong, UPS Options in Bi-directional HFC Network (approximate title). Experience Communications Journal, 2004, v. 15, issue 159, p. 99 (approximate source). (English translation not available).

Di Yuhui, Liu Jia-ping, Huang Xiang, Climate Demarcating for Application of Evaporative Cooling Air Conditioning, Heating Ventilation & Air Conditioning (HV&AC), Mar. 8, 2010, Issue 2, pp. 208-211.

"Allowing for Continuous Execution of Design and Construction" Ascent Corporation; 2009; 2 pages.

IBM; "Rx for Server Room Growth: Design a Scalable Modular Data Center"; IBM Global Services; Aug. 2009; 16 pages.

PCT; "Notification of Transmittal of the International Search Report and the Written Opinion of the International Searching Authority, or the Declaration" cited in PCT/US2010/041734; mailed Mar. 31, 2011; 9 pages.

* cited by examiner

FLEXIBLE DATA CENTER AND METHODS FOR DEPLOYMENT

BACKGROUND

A data center is a facility used to house computing systems and associated components. Data centers may include racks to store computing systems, elevated floors, cable runways, cooling systems, power systems, security systems, and the like. Many of the computing systems housed in a data center can be stored on server racks, which may be arranged in rows forming corridors therebetween. Current data center design may be based on a client-server computing model to provide, for instance, Internet connectivity and/or solutions for systems operation.

New data centers may generally take the form of either brick and mortar or containerized. A brick and mortar data center can include a number of buildings or additions to an existing building, which house the data center. A new brick and mortar data center may be designed and built according to a specific customer demand. New brick and mortar data centers may come with a significant initial capital expenditure to provide for the design, provisioning, and construction of the new brick and mortar data center. New brick and mortar data centers may take approximately 9 to 24 months to design and build (e.g., depending upon a size of the data center).

A containerized data center can provide a more timely and cost effective solution. Containerized data centers may be prefabricated mass produced and may be shipped to a customer (e.g., by ships and trucks). However, containerized data centers may be unappealing in that they may provide, or may be perceived to provide, a short-term, low reliability solution without considering long-term needs for an organization served by the data center. Furthermore, as organizations continue to rethink fiscal expenditures for data centers, containerized approaches, while including lower initial capital expenditures than brick and mortar facilities, may be perceived as wasteful due to the real or perceived short-term solution they offer.

Brick and mortar data centers designed and built according to some previous approaches were generally non-scalable and built with one goal in mind, therefore limited with respect to flexibility. However, such brick and mortar data centers could provide a traditional data center environment with some creature comforts that are not afforded by the use of containerized data centers. Such containerized data centers may take a minimalist approach (e.g., by installing server racks in a containerized solution that provides for rapid deployment with little to no creature comforts). Brick and mortar data centers still account for a majority of the market, while containerized data centers are gaining a foothold in the market of fast deployment and/or the market of 5-year strategies with tech-refresh in mind.

DETAILED DESCRIPTION

Embodiments of the present disclosure may include flexible data center (FlexDC) systems and methods of deployment. A flexible data center including T rows of server racks can be deployed by constructing a number B of blocks. Constructing each block can include constructing from one to a number P of perimeter structures each housing up to a number R of rows of server racks. Constructing each block can include constructing a connecting structure connected to the perimeter structures, the connecting structure housing operations monitoring equipment for the server racks. A total integer number T/R of perimeter structures can be constructed for the flexible data center. At most one perimeter structure houses less than R rows of server racks. B is equal to an integer number (T/R)/P. At most one block includes less than P perimeter structures.

Examples of the present disclosure can provide modularity, scalability, flexibility, industrialization, cloud computing, Infrastructure as a Service (IaaS) platform, and containerization of mechanical and electrical solutions, climate control, expanding criteria for information technology (IT) space, and supply chain management for data centers. Such examples of flexible data centers can bridge the gap between containerized data centers and brick and mortar data centers to provide the advantages of each in a cost effective long term solution for data center design and deployment. For example, a flexible data center, according to the present disclosure, can be provided with an initial price of less than $7 million per megawatt and a time to market of 24 to 36 weeks. Furthermore, short-term demand for expansion and growth of data centers is addressed by the present disclosure. Accordingly, examples of the present disclosure can provide a valuable solution for cloud computing and IaaS with improved optimization of availability, energy efficiency, and total cost of ownership as compared to previous approaches. Such an approach can allow business growth to be synchronized to the capital and operational investment from their IT in an "industrialized IT" fashion.

Examples of the present disclosure can provide a flexible data center that is responsive to growth requirements and flexible enough to meet changing aspects of data center technology. For example, flexible data centers according to the present disclosure can be provided as greenfield projects (e.g., unconstrained by prior data center solutions) or adjacent to existing buildings.

In the following detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the embodiments of this disclosure, and it is to be understood that other examples may be utilized and that process, electrical, and/or structural changes may be made without departing from the scope of the present disclosure. As used herein, the designators "T," "B," "P," and "R," including reference numerals in the drawings, indicate that a number of the particular feature so designated can be included with examples of the present disclosure. The designators can represent the same or different numbers of the particular features.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

Figure 1:
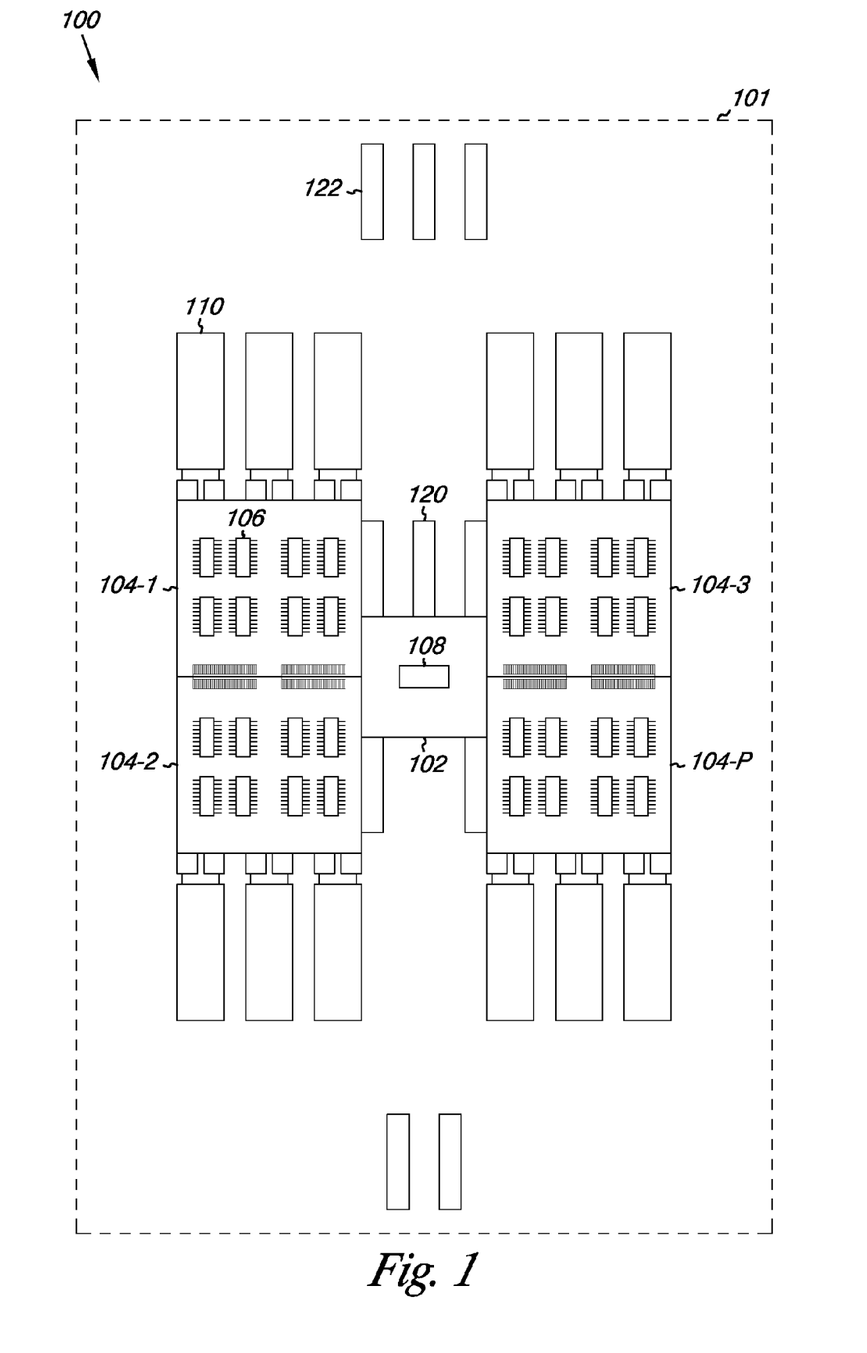
FIG. 1 illustrates a block diagram of an example of a flexible data center according to the present disclosure.
Figure 2:
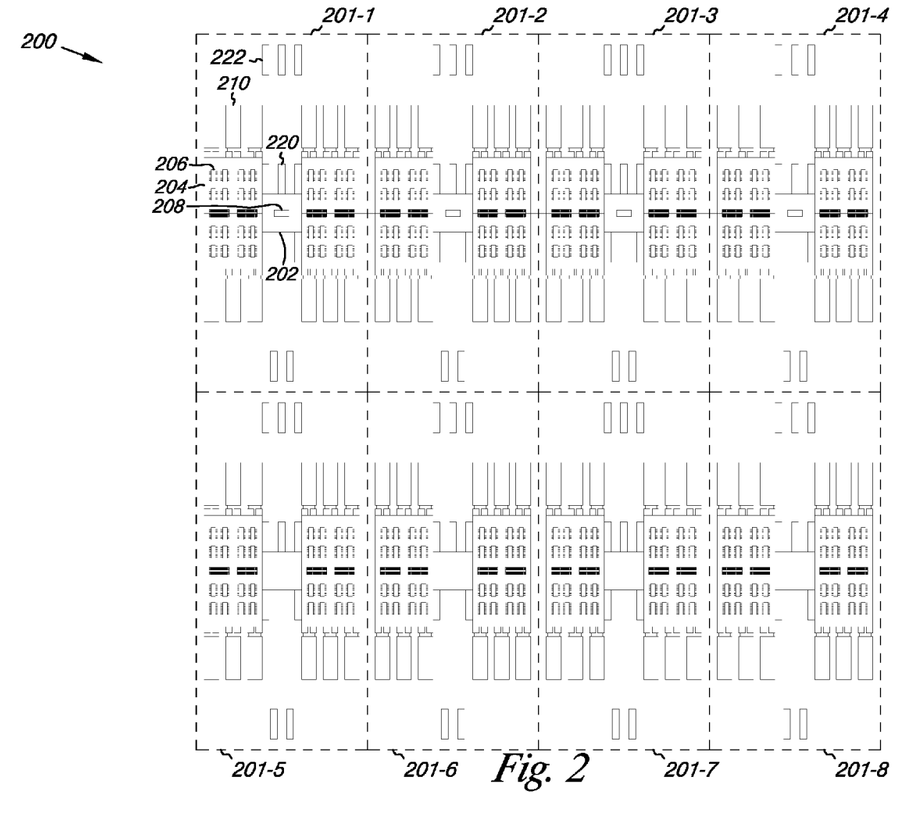
FIG. 2 illustrates a block diagram of an example of a flexible data center according to the present disclosure.

FIG. 1 illustrates a block diagram of an example of a flexible data center 100 according to the present disclosure. The flexible data center 100 can include a number B of blocks 101 on a site. Although only one block 101 is illustrated in FIG. 1, FIG. 2 illustrates a flexible data center 200 including more than one block 201. Each block 101 can include one to a number P of perimeter structures 104 (e.g., perimeter structures 104-1, 104-2, 104-3, . . . , 104-P). Each perimeter structure 104 can house up to a number R of rows of server racks 106.

Each block 101 can include a connecting structure 102 connected to the number of perimeter structures 104. The connecting structure 102 can house operations monitoring equipment 108 for the rows of server racks 106 in the block 101. The connecting structure 102 can house security systems, shipping and receiving, a network operations center, administration areas, and/or meeting rooms, among others. The number of perimeter structure 104 in each block 101 can retain full functionality with a complete loss of the connecting structure 102 (e.g., the connecting structure 102 is not a single point of failure for each block 101, and thus for the flexible data center 100).

The flexible data center 100 can include a total integer number T/R of perimeter structures 104. As used herein, "a total integer number T/R" indicates that the total number of perimeter structures 104 is equal to T (the total number of rows of server racks 106 housed in the data center 100) divided by R (the upper limit of the number of rows of server racks 106 housed in each perimeter structure 104) rounded up to an integer. Thus, for example, if T is equal to 33 and R is equal to 10, then the total integer number T/R of perimeter structures 104 would be 33/10 rounded up to an integer 4.

At most, one perimeter structure 104 associated with the flexible data center 100 houses less than R rows of server racks 106. That is, design of the flexible data center 100 can be such that a new perimeter structure 104 is not added until all of the current perimeter structures 104 contain the upper limit R of rows of server racks 106. Such examples can be beneficial to make efficient use of the space provided by the perimeter structures 104 as it may be more cost effective to fill perimeter structures 104 with rows of server racks 106 before incurring the cost of adding an additional perimeter structure 106. The total number B of blocks 101 included with the data center 100 can be equal to an integer number (T/R)/P, as is described in more detail with respect to FIG. 2. In some instances, a particular block 101 may initially be constructed with fewer than P perimeter structures 104 and then an additional perimeter structure 104 may be constructed after the flexible data center 100 has been deployed according to an increased demand for rows of server racks 106 for the flexible data center 100.

At most, one block 101 associated with the flexible data center 100 can include less than P perimeter structures 104. That is, design of the flexible data center 100 can be such that a new block 101 is not added until all of the current blocks 101 include the upper limit P of perimeter structures (e.g., until each connecting structure 102 associated with the flexible data center 100 is connected to P perimeter structures 104). Such examples can be beneficial to make efficient use of the ability of the blocks 101 to include up to P perimeter structures before constructing a new block 101 with a new connecting structure 102 and at least one perimeter structure 104.

A number of cooling units 110 can be connected to an exterior of a respective perimeter structure 104. The type of and/or the number of cooling units 110 is particular to a climate of the site. According to some examples of the present disclosure, cooling can be provided for the flexible data center 100 without the use of mechanical chiller plants. The cooling units 110 are described in more detail with respect to FIG. 3.

A number of power conditioner units 120 can be connected to an exterior of the respective perimeter structure 104. According to some examples of the present disclosure, the number of perimeter structures 104 do not include a power distribution unit. Not including a power distribution unit in a perimeter structure 104 may be advantageous by increasing end-to-end efficiency. A type of and/or the number of power conditioner units 120 can be particular to a desired power quality for the flexible data center 100. For design of the flexible data center 100, the number of power conditioner units 120 can be associated with an uninterruptable power supply (UPS) module selected from the group of UPS modules including a delta conversion UPS module, a double conversion UPS module, an offline UPS module, a flywheel UPS module, and a diesel rotary UPS module. A number of electrical topologies can be provided for a particular flexible data center 100. For example, topologies can include "N" (a single utility source), "N+1" (at least one redundant component), and a "2N" (dual path), or a combination of topologies to achieve redundancy, concurrent maintainability, and/or a fault tolerance of the flexible data center 100, among others.

Each perimeter structure 104 (e.g., the rows of server racks 106 therein) can consume up to a particular quantity of power. A number of backup power generators 122 may be electrically connected to the flexible data center 100 according to the particular quantity of power used by each of the perimeter structures 104 associated therewith. As used herein, "electrically connected" means that the backup power generators 122 may be connected to the flexible data center 100 so as to provide electrical power to the flexible data center 100, however it does not require that the backup power generators 122 be mechanically coupled to an exterior of the structure of the flexible data center 100. In various examples of the present disclosure, the backup power generators 122 may either be adjacent to the structure of the flexible data center 100 or they may be free-standing backup power generators separate 122 from the structure of the flexible data center 100.

An example of the present disclosure includes a flexible data center 100 including one block 101 having one connecting structure 102 and up to four perimeter structures 104. With four perimeter structures 104, the flexible data center 100 can provide a total of 3.2 megawatts of IT power and 400 kilowatts of network/communications support power with a power usage effectiveness (PUE) less than 1.28.

The four perimeter structures 104 can be connected to the connecting structure 102 in a butterfly configuration (e.g., an "H" configuration) as illustrated in FIG. 1. That is, a first perimeter structure 104-1 can be connected along an exterior wall to an exterior wall of a second perimeter structure 104-2. The exterior walls connecting the first 104-1 and the second 104-2 perimeter structures can be perpendicular to the connecting structure 102. The first 104-1 and the second 104-2 perimeter structures can have collinear exterior walls perpendicular to the walls connecting the perimeter structures and connected to an exterior wall of the connecting structure 102. A third 104-3 and a fourth 104-P perimeter structure can be connected to each other analogous to the connection between the first 104-1 and the second 104-2 perimeter structures. Likewise, the third 104-3 and the fourth 104-P perimeter structures can be connected to the connecting structure 102 analogous to the connection between the first 104-1 and the second 104-2 perimeter structures and the connecting structure 102, although the third 104-3 and the fourth 104-P perimeter structures can be connected to an exterior wall of the connecting structure 102 opposite the exterior wall of the connecting structure 102 to which the first 104-1 and the second 104-2 perimeter structures are connected.

An example of a benefit of including a number of perimeter structures 104 with the design of a flexible data center 100 is that the perimeter structures 104 can allow for segregation of IT assets. IT assets can be segregated, for example, by group, security level, and/or function type (e.g., software development, production, disaster recovery, etc.), among others. Another example may be deployment of Converged Infrastructure with flexible data center 100 including perimeter structures of server, storage, desktops, and/or network devices.

FIG. 2 illustrates a block diagram of an example of a flexible data center 200 according to the present disclosure. The flexible data center 200 includes a number of blocks 201-1, 201-2, 201-3, 201-4, 201-5, 201-6, 201-7, . . . , 201-B. Each block 201 can be analogous to block 101 illustrated in FIG. 1. Each block 201 can include a connecting structure 202 housing operations monitoring equipment 208. The connecting structure 202 can be connected to a number of perimeter structures 204 housing a number of rows of server racks 206. Each block 201 can include a number of cooling units 210, a number of power conditioning units 220, and a number of backup power generation units 222.

The total number B of blocks 201 included with the flexible data center 200 can be equal to an integer number (T/R)/P, where T is equal to the total number of rows of server racks 206 in the flexible data center 200, R is equal to an upper limit of the number of rows of server racks 206 for each perimeter structure 204, and P is equal to an upper limit of the number of perimeter structures 204 for each block 201. As described herein, "equal to an integer number" indicates that a result of "(T/R)/P" is rounded up to an integer number. Thus, for example, where T is equal to 300, R is equal to ten, and P is equal to four, B is equal to (300/10)/4, which rounds up to an integer of eight (e.g., as illustrated in FIG. 2).

As illustrated in FIG. 2, constructing the number of blocks 201 can include constructing a first block 201-1 and constructing a second block 201-2 adjacent to the first block 201-1 without connecting structures associated with the second block 201-2 to structures associated with the first block 201-1. Structures associated with a block 201 can include a connecting structure 202 and/or a number of perimeter structures 204, among others.

Although not specifically illustrated in FIG. 2, constructing a first block 201-1 can include constructing P first perimeter structures 204 and constructing a second block 201-2 can include constructing from one to P second perimeter structures 204 above the first perimeter structures 204. That is, according to some examples of the present disclosure, two or more bocks 201 can be constructed in a vertical stack (e.g., analogous to a two or more story building) vertically rather than constructing the blocks 201 horizontally adjacent to each other on the ground (e.g., analogous to one story buildings).

Such examples of stacking blocks 201 can be beneficial for those sites where space is at a premium (e.g., in urban areas, densely populated areas, areas of rough terrain, etc.).

Figure 3:
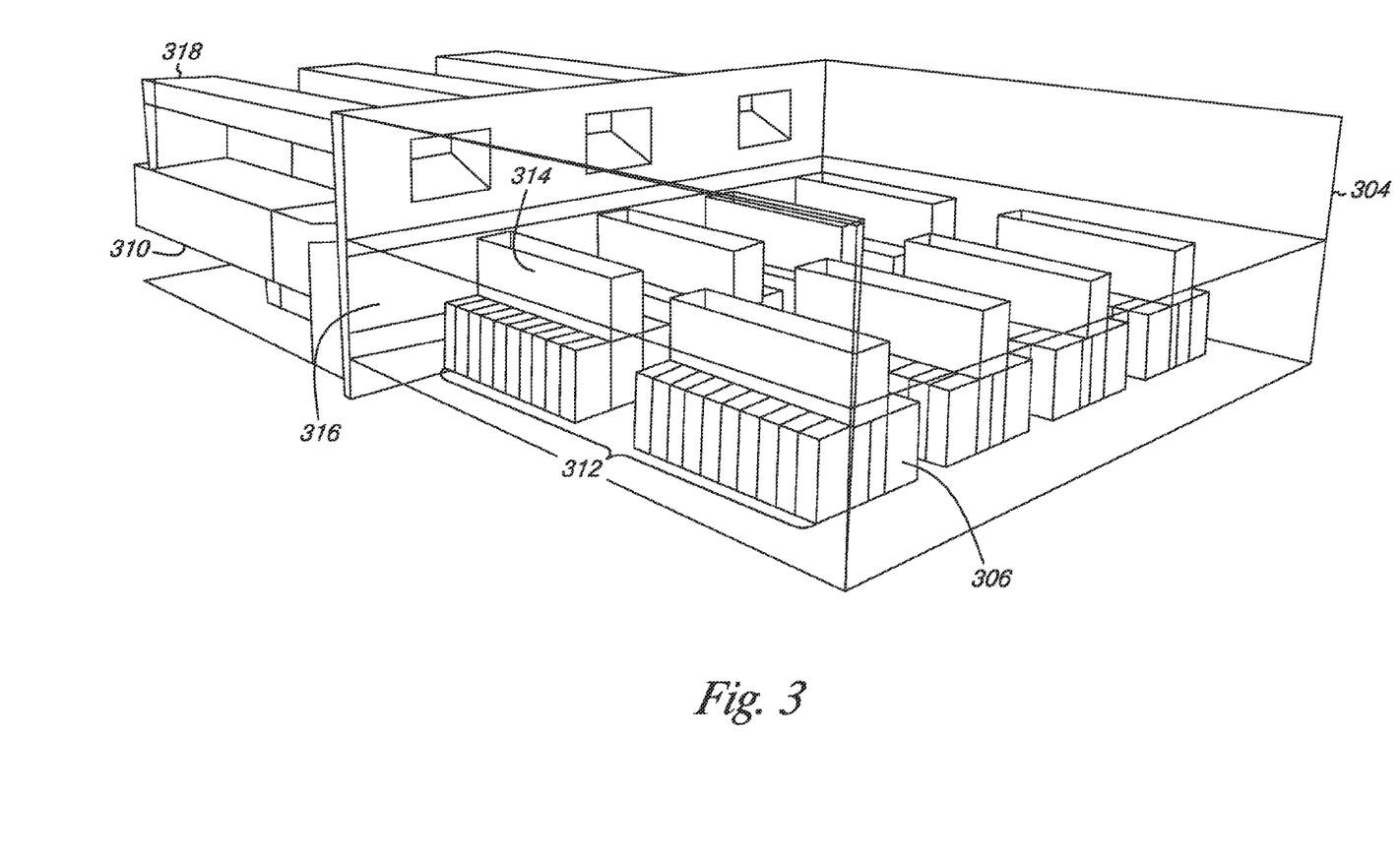
FIG. 3 illustrates a perspective view of an example of a number of cooling units connected to an exterior of a perimeter structure for a flexible data center including according to the present disclosure.

FIG. 3 illustrates a perspective view of an example of a number of cooling units 310 connected to an exterior of a perimeter structure 304 for a flexible data center including according to the present disclosure. The perimeter structure 304 includes a number of rows of server racks 306 therein. An interior of the perimeter structure can be pressurized with cool air from the number of cooling units 310. Cool air can be input 316 from the number of cooling units 310 into a volume of the perimeter structure 304 at a level of the number of rows of server racks 306 as illustrated in FIG. 3. Warm air can be outlet 318 from the volume of the perimeter structure 304 via hot aisle 312 containing the number of rows of server racks 306 and ducting 314 warm air from above the number of rows of server racks 306. In some examples of the present disclosure a length of the number of rows of server racks 306 can have an upper limit of 18 feet.

For design of the flexible data center, the number of cooling units 310 can be selected from a group of cooling units 310 including direct expansion and direct evaporative cooling units, direct expansion and indirect evaporative cooling units, heat transfer wheel cooling units, and air-to-air exchanger with direct expansion cooling units. A direct expansion and direct evaporative cooling unit can include a supply fan, filters, direct evaporative media, and a direct expansion cooling assembly. A direct expansion and indirect evaporative cooling unit can include a supply fan, filters, indirect evaporative media, and a direct expansion cooling assembly. A heat transfer wheel cooling unit can include multiple supply and exhaust fans, filters, a heat transfer wheel, and a direct expansion cooling assembly. Each type of cooling unit 310 can provide particular efficiencies for a given climate (e.g., some may function more efficiently in certain climates). Furthermore, some cooling unit 310 types can help reduce or eliminate introduction of external contaminates into the flexible data center, which may occur with some outdoor air economizers.

A menu driven process can be provided for selecting the type of cooling unit 310 from a predetermined number of types of cooling units 310. The selection process can be validated via an energy optimization evaluation of selected cooling units 310 according to the climate of the site where the flexible data center is constructed. Such a menu driven process can be provided by a set of machine readable instructions stored in a tangible non-transitory medium.

A machine (e.g., a computing device) can include a tangible non-transitory medium storing a set of machine readable instructions. Such a tangible non-transitory medium can include volatile and/or non-volatile memory such as random access memory (RAM), magnetic memory such as a hard disk, floppy disk, and/or tape memory, a solid state drive (SSD), flash memory, phase change memory, and the like. The instructions can be executed by a processor associated with the machine to provide the menu driven process for cooling unit 310 selection and/or selection of other features such as a number of rows of server racks 306, a number of blocks, a number of perimeter structures 304, a number and/or type of power conditioner units, a number and/or type of backup power generation, among others.

Figure 4:
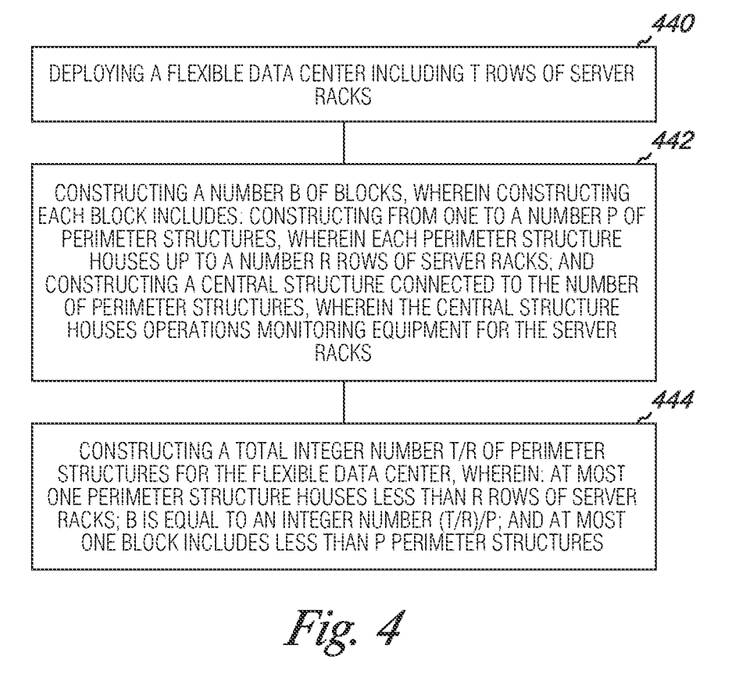
FIG. 4 provides a flow chart illustrating an example of a method for deploying 440 of a flexible data center including T sever racks according to the present disclosure.

FIG. 4 provides a flow chart illustrating an example of a method for deploying 440 of a flexible data center including T sever racks according to the present disclosure. The method includes constructing 442 a number B of blocks, wherein constructing each block includes: constructing from one to a number P of perimeter structures, wherein each perimeter structure houses up to a number R of rows of server racks; and constructing a connecting structure connected to the number of perimeter structures, wherein the connecting structure houses operations monitoring equipment for the rows of server racks.

The method includes constructing 444 a total integer number T/R of perimeter structures for the flexible data center, wherein: at most one perimeter structure houses less than R rows of server racks; B is equal to an integer number (T/R)/P; and at most one block includes less than P perimeter structures.

It is to be understood that the above description has been made in an illustrative fashion, and not a restrictive one. Although specific examples have been illustrated and described herein, other component arrangements, instructions, and/or device logic can be substituted for the specific examples shown.

What is claimed:

1. A method of deploying a flexible data center including T rows of server racks, comprising:
    constructing a number B of blocks on a site, wherein constructing each block includes:
        constructing from one to a number P of perimeter structures, wherein each perimeter structure houses up to a number R of rows of server racks; and
        constructing a connecting structure connected to the number P of perimeter structures, wherein the connecting structure houses operations monitoring equipment for the server racks;
    constructing a total integer number T/R of perimeter structures comprising the number P of perimeter structures for the flexible data center, wherein:
        each perimeter structure consumes up to a quantity of power;
        at most one perimeter structure houses less than R rows of server racks;
        B is equal to an integer number (T/R)/P; and
        at most one block includes less than P perimeter structures;
    selecting a number of power conditioner units for each perimeter structure according to a desired power quality;
    validating the number of power conditioner units for each perimeter structure via an energy optimization evaluation of the number of the power conditioner units according to a climate of the site;
    connecting the number of power conditioner units to each perimeter structure;
    providing a menu driven process for selecting a type of cooling unit from a predetermined plurality of types of cooling units;
    selecting the type of cooling unit from the predetermined plurality of types of cooling units according to the climate of the site;
    validating the type of cooling unit that is selected via an energy optimization evaluation of selected cooling units according to the climate of the site; and
    connecting a number of cooling units of the type of cooling unit that is selected to an exterior of a respective perimeter structure.

2. The method of claim 1, wherein:
    the number P of perimeter structures retain functionality independent of the connecting structure;
    P is equal to four; and
    the method includes connecting P perimeter structures to the connecting structure in a butterfly configuration.

3. The method of claim 1, wherein the method includes:
    pressurizing the respective perimeter structure with cool air from the number of cooling units;
    inputting cool air from the number of cooling units into a volume of the respective perimeter structure at a level of the rows of server racks; and
    outleting warm air from the volume of the respective perimeter structure into the number of cooling units by ducting the warm air from above the rows of server racks.

4. The method of claim 1, wherein the method includes connecting a number of backup power generation units to the flexible data center according to the quantity of power.

5. The method of claim 1, wherein the constructing the number B of blocks includes constructing a particular block including:
    initially constructing less than P perimeter structures; and
    constructing an additional perimeter structure after the flexible data center has been deployed according to an increased demand for rows of server racks for the flexible data center.

6. The method of claim 1, wherein the constructing the number B of blocks includes constructing a first block including:
    constructing P first perimeter structures; and
    constructing a second block that includes one to P second perimeter structures above the first perimeter structures.

7. The method of claim 1, wherein the constructing the number B of blocks includes:
    constructing a first block; and
    constructing a second block adjacent to the first block without connecting structures associated with the second block to structures associated with the first block.

8. A flexible data center including T rows of server racks, comprising:
    a number B of blocks on a site, each block including:
        one to a number P of perimeter structures, wherein each perimeter structure houses up to a number R of rows of server racks; and
        a connecting structure connected to the number P of perimeter structures, wherein the connecting structure houses operations monitoring equipment for the server racks, and wherein the one to the number P of perimeter structures retain functionality independent of the connecting structure;
    a total integer number T/R of perimeter structures comprising the number P of perimeter structures, wherein:
        at most one perimeter structure houses less than R rows of server racks;
        B is equal to an integer number (T/R)/P; and
        at most one block includes less than P perimeter structures;
    a number of cooling units connected to an exterior of a respective perimeter structure, wherein a type of the number of cooling units is particular to a climate of the site; and
    a number of power conditioner units connected to the exterior of the respective perimeter structure, wherein a type of the number of power conditioner units is particular to a desired power quality and to the climate of the site.

9. The flexible data center of claim 8, wherein:
    the number of cooling units is selected from the group of cooling units including:
        direct expansion and direct evaporative cooling units;
        direct expansion and indirect evaporative cooling units;
        heat transfer wheel cooling units; and air-to-air heat exchanger with direct expansion cooling units; and the number of power conditioner units is associated with an uninterruptable power supply (UPS) selected from a group of UPS modules including:
a delta conversion UPS module;
a double conversion UPS module;
an offline UPS module;
a flywheel UPS module; and
a diesel rotary UPS module.

10. The flexible data center of claim 8, wherein the total integer number T/R of perimeter structures is greater than P; and a number of the total integer number T/R of perimeter structures are is constructed in a location selected from a group of locations including:
in one of the number of blocks above a block including P of the perimeter structures; and
in one of the number of blocks adjacent to a block including P of the perimeter structures.

11. The flexible data center of claim 8, wherein:
B equals one;
P equals four and the flexible data center includes four perimeter structures; and
the flexible data center provides a total of 3.2 megawatts of information technology power and 400 kilowatts of network/communications support with a power usage effectiveness less than 1.28.

12. The flexible data center of claim 8, wherein the number P of perimeter structures do not include a power distribution unit.

\* \* \* \* \*